United States Patent
Grenouillet et al.

(10) Patent No.: US 11,189,792 B2
(45) Date of Patent: Nov. 30, 2021

(54) OXIDE-BASED RESISTIVE NON-VOLATILE MEMORY CELL AND METHOD FOR MANUFACTURING SAME

(71) Applicant: COMMISSARIAT A L'ENERGIE ATOMIQUE ET AUX ENERGIES ALTERNATIVES, Paris (FR)

(72) Inventors: Laurent Grenouillet, Claix (FR); Marios Barlas, St Martin D'Heres (FR); Philippe Blaise, Grenoble (FR); Benoît Sklenard, Grenoble (FR); Elisa Vianello, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 49 days.

(21) Appl. No.: 16/331,714

(22) PCT Filed: Sep. 8, 2017

(86) PCT No.: PCT/EP2017/072622
§ 371 (c)(1),
(2) Date: Mar. 8, 2019

(87) PCT Pub. No.: WO2018/046683
PCT Pub. Date: Mar. 15, 2018

(65) Prior Publication Data
US 2019/0280203 A1    Sep. 12, 2019

(30) Foreign Application Priority Data
Sep. 9, 2016    (FR) ...................................... 1658446

(51) Int. Cl.
*H01L 45/00*    (2006.01)
*H01L 27/24*    (2006.01)

(52) U.S. Cl.
CPC ........ *H01L 45/165* (2013.01); *H01L 27/2463* (2013.01); *H01L 27/2472* (2013.01);
(Continued)

(58) Field of Classification Search
CPC . H01L 45/165; H01L 27/2472; H01L 45/085; H01L 45/1246; H01L 27/2463;
(Continued)

(56) References Cited

U.S. PATENT DOCUMENTS 8,835,272 B1 *   9/2014   Mickel ................. H01L 45/085
                                                         438/382
9,727,258 B1 *   8/2017   Nazarian ............. G06F 11/1048
(Continued)

OTHER PUBLICATIONS

International Search Report as issued in International Patent Application No. PCT/EP2017/072622, dated Dec. 11, 2017.
(Continued)

*Primary Examiner* — Samuel Park
(74) *Attorney, Agent, or Firm* — Pillsbury Winthrop Shaw Pittman LLP

(57) ABSTRACT

A resistive non-volatile memory cell includes a first electrode, a second electrode and an oxide layer disposed between the first electrode and the second electrode, the memory cell being capable of reversibly switching between: —a high resistance state obtained by applying a first bias voltage between the first electrode and the second electrode; and—a low resistance state obtained by applying a second bias voltage between the first electrode and the second electrode; the oxide layer including a switching zone forming a conduction path prioritised for the current passing through the memory cell when the memory cell is in the low resistance state. The oxide layer includes a first zone doped with aluminium or silicon, the aluminium or silicon being present in the first zone with an atomic concentration that is (Continued)

selected so as to locate the switching zone outside the first zone.

13 Claims, 5 Drawing Sheets

(52) U.S. Cl.
CPC ............ *H01L 45/08* (2013.01); *H01L 45/085* (2013.01); *H01L 45/1233* (2013.01); *H01L 45/1246* (2013.01); *H01L 45/1253* (2013.01); *H01L 45/146* (2013.01)

(58) Field of Classification Search
CPC . H01L 45/08; H01L 45/1233; H01L 45/1253; H01L 45/146; H01L 27/2409; H01L 2924/0002; H01L 27/2481; H01L 2924/00; H01L 21/265; H01L 21/0228; H01L 21/02181; H01L 22/34; H01L 45/1616; H01L 45/1641; H01L 45/1625; H01L 45/12; H01L 45/145; H01L 45/1608; H01L 45/06; H01L 27/2841; H01L 45/144; H01L 45/04; H01L 45/1226; H01L 45/10; H01L 45/1266; H01L 45/122

See application file for complete search history.

(56) References Cited

U.S. PATENT DOCUMENTS

| | | | |
|---|---|---|---|
| 2012/0069624 A1 | 3/2012 | Ramaswamy et al. | |
| 2012/0295398 A1 | 11/2012 | Kurunczi et al. | |
| 2014/0138602 A1* | 5/2014 | Miller | H01L 21/322 257/3 |
| 2014/0322862 A1* | 10/2014 | Xie | H01L 27/249 438/104 |
| 2014/0322887 A1 | 10/2014 | Miller et al. | |
| 2017/0170394 A1* | 6/2017 | Chen | H01L 45/085 |
| 2018/0175291 A1* | 6/2018 | Chu | G11C 13/0007 |

OTHER PUBLICATIONS

Hayakawa, Y., et al., "Highly reliable $TaO_x$ ReRam with centralized filament for 28-nm embedded application," 2015 Symposium on VLSI Technology Digest of Technical Papers, (2015), pp. T14-T15.

* cited by examiner

OXIDE-BASED RESISTIVE NON-VOLATILE MEMORY CELL AND METHOD FOR MANUFACTURING SAME

CROSS-REFERENCE TO RELATED APPLICATIONS

This application is the U.S. National Stage of PCT/EP2017/072622, filed Sep. 8, 2017, which in turn claims priority to French patent application number 1658446, filed Sep. 9, 2016. The content of these applications are incorporated herein by reference in their entireties.

TECHNICAL FIELD OF THE INVENTION

The technical field of the invention is that of non-volatile memories, and more specifically that of oxide based resistive random access memories.

TECHNOLOGICAL BACKGROUND OF THE INVENTION

Resistive random access memories are non-volatile memories but which have sufficiently high operating speeds to aspire to replace both current random access memories and non-volatile memories such as flash type memories.

Resistive random access memories are based on an active material that can reversibly switch between two resistance states that make it possible to encode an information bit. Resistive random access memories exist for which the active material is oxide based. This is the case notably of OxRAM (Oxide resistive Random Access Memory) type memories and certain CBRAM (Conductive Bridging Random Access Memory) type memories.

Oxide based resistive random access memories have a high integration density and are compatible with CMOS technology manufacturing methods. Oxide based resistive random access memories may be not just Back-End-Of-Line (BEOL) integrated but also Front-End-Of-Line (FEOL) integrated.

An oxide based resistive random access memory includes a multitude of memory cells laid out in lines and in columns to form a matrix. Each memory cell comprises an oxide layer arranged between two electrodes. The oxide layer reversibly switches between two resistance states as a function of the voltage applied to the memory cell. A writing voltage is used to pass the oxide layer to a low resistance state, whereas an erasing voltage is used to pass the oxide layer to a high resistance state.

The change of resistance state is linked to the formation and to the breaking, in the oxide layer, of a switching zone, which forms an electrically conductive path connecting the electrodes of the memory cell. For example, in CBRAM memories, the conductive path is a filament formed by metal ions, and in OxRAM memories, the formation of the conductive path is attributed to the accumulation of oxygen vacancies within the oxide layer.

However, these conduction modes involve a great variability of the resistance states among the different memory cells of the matrix. One cause of variability stems from the location of the oxide layer where the switching zone forms. In particular, the edges of a memory cell have defects, notably due to their etching, which introduces additional variability when the switching zone forms near to one of these edges.

Ideally, the resistance states each have a discrete value but, in practice, the resistance states each stretch out over a range of values. The resistance states may thus overlap, which makes it difficult to distinguish between the low resistance state and the high resistance state. In order to avoid this, it may thus be necessary to increase the size of the memory window of the cells, that is to say the difference between the resistance values defining the low resistance state and the high resistance state.

It is possible to manufacture a memory cell with a high memory window but to the detriment of other characteristics of the memory cell, such as the time during which the information bit may be stored in the cell when the temperature increases, which is known as "data retention", and to the "endurance", that is to say the number of times that it is possible to write in the memory cell.

With the aim of improving the performances of oxide based resistive random access memory cells, there thus appears a need to reduce the variability of the resistance states of the memory cells by controlling the location of the switching zone in the oxide layer.

It is known from the document HAYAKAWA Y. et al. 'Highly reliable TaOx ReRAM with centralized filament for 28-nm embedded application'. In: 2015 Symposium on VLSI Technology, Kyoto, ISSN 0743-1562, to carry out an oxidation of the edges of the memory cell, having for effect the formation of the switching zone at the centre of the memory cell.

However, to be applicable, this method requires etching the oxide layer in order to expose its edges to oxidation, which complicates the implementation of said method.

SUMMARY OF THE INVENTION

The present invention aims to provide an oxide based resistive non-volatile memory cell in which the location of the filament is controlled in a simple manner, the memory cell thereby having lower variability.

To this end, the invention proposes a resistive non-volatile memory cell comprising a first electrode, a second electrode and an oxide layer arranged between the first electrode and the second electrode, the memory cell being capable of reversibly switching between:
  a high resistance state obtained by applying a first bias voltage between the first electrode and the second electrode; and
  a low resistance state obtained by applying a second bias voltage between the first electrode and the second electrode;
the oxide layer comprising a switching zone forming a favoured conduction path for the current passing through the memory cell when the memory cell is in the low resistance state, the oxide layer comprising a first zone doped with aluminium or silicon, the aluminium or silicon being present in the first zone at an atomic concentration that is selected so as to locate the switching zone outside the first zone.

Before any use of the memory cell, a forming voltage is applied to the memory cell in order to form the switching zone for the first time. It has been found that by doping in a suitable manner the first zone with aluminium or silicon, to form the switching zone in the first doped zone, it is necessary to apply to the memory cell a first forming voltage greater than a reference forming voltage that it is necessary to apply to form the switching zone in the non-doped oxide layer. In other words, by keeping the forming voltage less than the first forming voltage, the switching zone forms in the places where the oxide layer is not doped. Thanks to the invention, it is thus possible to control in a simple manner the location of the switching zone by suitable doping of the oxide layer, which thereby makes it possible to reduce the variability of the memory cells.

The memory cell according to the first aspect of the invention may also comprise one or more characteristics among the following, considered individually or according to all technically possible combinations thereof:
- the first doped zone extends to the periphery of the memory cell; Thus, the location of the switching zone is far from the edges of the memory cell;
- the first zone is doped with silicon, the atomic concentration of silicon in the first zone is comprised between 0.1% and 2%;
- the oxide layer comprises a second zone doped with silicon, the silicon being present in the second zone at an atomic concentration that is selected so as to locate the switching zone in the second zone;
- the first zone completely surround the second zone;
- the first zone comprises:
    - a first portion and a second portion extending on either side of the second zone along a first direction;
    - a third portion and a fourth portion extending on either side of the second zone along a second direction substantially orthogonal to the first direction;
- the atomic concentration of silicon in the second zone is greater than 3%;
- the oxide layer (3) comprises a material among the following: hafnium oxide, titanium oxide, tantalum oxide.

A second aspect of the invention relates to a method for manufacturing a resistive non-volatile memory cell comprising a first electrode, a second electrode and an oxide layer arranged between the first electrode and the second electrode, the memory cell being capable of reversibly switching between:
- a high resistance state obtained by applying a first bias voltage between the first electrode and the second electrode; and
- a low resistance state obtained by applying a second bias voltage between the first electrode and the second electrode;

the oxide layer comprising a switching zone forming a favoured conduction path for the current passing through the memory cell when the memory cell is in the low resistance state, the method comprising a step of formation in the oxide layer of a first zone doped with aluminium or silicon, the aluminium or silicon being present in the first zone at an atomic concentration that is selected so as to locate the switching zone outside the first zone.

The manufacturing method according to the second aspect of the invention may also comprise one or more characteristics among the following, considered individually or according to all technically possible combinations thereof:
- the step of formation comprises a first step of ion implantation of aluminium or silicon in the first zone;
- the step of formation comprises a first step of ion implantation of silicon in a first region of the oxide layer and a second step of ion implantation of silicon in a second region of the oxide layer, the first region and the second region merging at least partially and forming:
    - the first zone of the oxide layer in which the first region and the second region are not merged; and
    - a second zone of the oxide layer in which the first region and the second region are merged;
- the first implantation step and the second implantation step being carried out at doses such that silicon is present in the second zone at a total atomic concentration that is selected so as to locate the switching zone in the second zone;
- the first implantation step comprises a first operation of masking the oxide layer carried out in such a way that the first region forms a first trench extending along a first direction, and in that the second implantation step comprises a second operation of masking the oxide layer carried out in such a way that the second region forms a second trench extending along a second direction substantially orthogonal to the first direction, the second trench crossing the first trench, the second zone being formed by the intersection of the first trench and the second trench;
- the method comprises a step of deposition, on the oxide layer, of an electrically conductive layer intended to form an electrode, the first implantation step and/or the second implantation step being carried out after the step of deposition of the electrically conductive layer.

BRIEF DESCRIPTION OF THE FIGURES

The invention and its different applications will be better understood on reading the description that follows and by examining the figures that accompany it, among which.

Figure 1A:
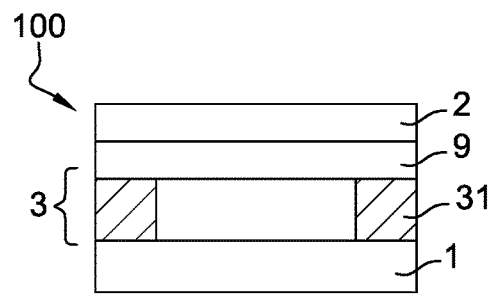
FIG. 1A schematically represents a transversal sectional view of a first embodiment of a memory cell according to the invention.

The figures are only presented for indicative purposes and in no way limit the invention.

For greater clarity, identical or similar elements are marked by identical reference signs in all of the figures.

DETAILED DESCRIPTION OF EMBODIMENTS OF THE INVENTION

Different embodiments of a memory cell according to the invention will now be described, with reference to FIGS. 1A to 3B.

Whatever the embodiment, the memory cell comprises a first electrode 1, a second electrode 2 and an oxide layer 3 arranged between the first electrode 1 and the second electrode 2. The first electrode 1 is for example arranged on a substrate (not represented), the first electrode 1 being designated as lower electrode. The second electrode 2 is then designated as upper electrode.

In the context of the invention, the terms "lower" and "upper" are used to characterise the position of the electrodes within the reference frame of the substrate.

The substrate is for example made of silicon and may comprise other layers already formed above.

The electrodes 1, 2 are electrically conductive layers and may comprise one or more conductive materials such as titanium nitride, doped silicon, tungsten, tungsten nitride, metal silicides, platinum. The electrodes 1, 2 have a thickness preferably comprised between 5 nm and 30 nm.

The oxide layer 3 preferably comprises an oxide of a transition metal such as hafnium oxide, tantalum oxide, titanium oxide, nickel oxide, tungsten oxide or zinc oxide. The oxide layer 3 may also comprise silicon oxide, aluminium oxide, indium oxide or gadolinium oxide. Optionally, the oxide layer 3 may comprise several superimposed oxide sub-layers. The oxide layer 3 has a thickness preferably comprised between 3 nm and 20 nm, and even more preferentially comprised between 5 nm and 10 nm.

The memory cell is an oxide based memory cell, the operation of which is as follows. The oxide layer 3, and more generally the memory cell, can reversibly switch between two resistance states. When a voltage is applied to the memory cell, a current of greater or lesser intensity according to the resistance state in which the memory cell finds itself passes through said cell.

During a writing operation, a writing voltage is applied to the memory cell to form a switching zone in the oxide layer 3, between the electrodes 1, 2. The memory cell thereby passes to a low resistance state (LRS). In this state, the current passing through the memory cell is considered as being of high intensity, and this current mainly passes through the switching zone which has a lower resistance than the remainder of the oxide layer 3.

During an erasing operation, an erasing voltage is applied to the memory cell to break the switching zone. The memory cell thereby passes to a high resistance state (HRS). In this state, the current passing through the memory cell is considered as being of low intensity.

When the memory cell is in its original state, just after the manufacture thereof, the switching zone is formed for the first time by applying to the memory cell a forming voltage greater than the writing voltage. Next, the memory cell enters into a normal operating mode in which the writing voltage and the erasing voltage are used to switch the resistance state of the memory cell.

Once the switching zone has been formed for the first time at one place of the oxide layer 3, it always reforms at this place during later writing operations.

At any moment, the resistance state in which the memory cell finds itself may be determined by applying thereto a reading voltage.

In OxRAM type memory cells, an explanation for the formation of the switching zone is the accumulation of oxygen vacancies within the oxide layer 3. Advantageously, the memory cell may comprise a layer 9 formed with a material having a strong affinity with oxygen, this layer thereby forming a reservoir of oxygen vacancies which facilitates the formation of the switching zone by providing the necessary vacancies. The reservoir layer 9 is for example arranged between the oxide layer 3 and the upper electrode 2. The reservoir layer has a thickness preferably comprised between 2 nm and 10 nm, and even more preferentially comprised between 3 nm and 7 nm. The reservoir layer 9 comprises for example titanium, zirconium, hafnium or lanthanum.

The present invention is based on the finding according to which, when the oxide layer 3 is doped with aluminium or silicon, the forming voltage of the switching zone in the oxide layer 3 varies as a function of the atomic concentration of aluminium or silicon in the oxide layer 3.

In the remainder of the description, the term "doping element" equally well refers to aluminium or silicon.

Throughout the description and in the claims, the atomic concentration C of the doping element in a considered zone of the oxide layer 3 is expressed in percentage and is defined by the following relationship:

$$C = 100 * \frac{C_{dopant}}{C_{Ox} + C_{dopant}}$$

where $C_{dopant}$ is the concentration of atoms of the doping element present in the considered zone, and $C_{ox}$ is the concentration of atoms constituting the non-doped oxide layer 3, these $C_{dopant}$ and $C_{ox}$ concentrations being expressed in number of atoms per $cm^{-3}$.

The forming voltage when the atomic concentration of the doping element is zero, that is to say when the oxide layer 3 is not doped, is taken as reference voltage. When the oxide layer 3 is doped with silicon, the forming voltage begins to increase with the atomic concentration of silicon up to reaching a maximum value. Next, when the atomic concentration of silicon continues to increase, the forming voltage decreases, passing below the reference voltage. When the oxide layer 3 is doped with aluminium, the forming voltage increases linearly with the atomic concentration of aluminium.

Figure 4:
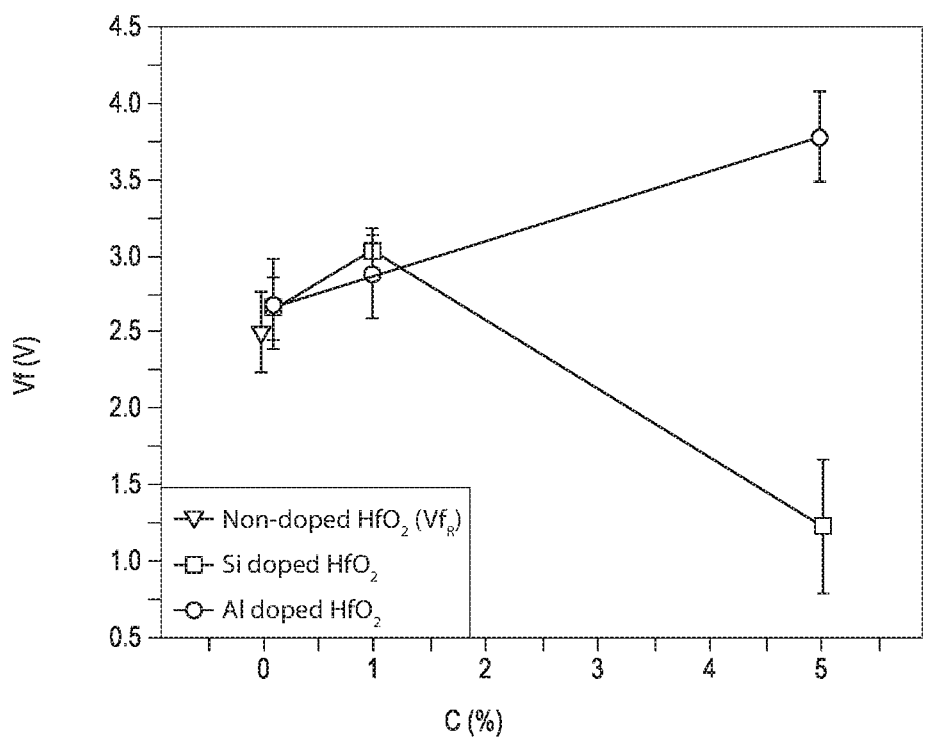
FIG. 4 shows the variation in the forming voltage of the switching zone in a hafnium oxide layer of 10 nm thickness as a function of the atomic concentration, expressed in percentage, of silicon or aluminium present in the hafnium oxide layer.

These phenomena are for example illustrated on the curves of FIG. 4 which represent the variation in the forming voltage $V_f$ measured in the hafnium oxide as a function of the atomic concentration C of the doping element present in the hafnium oxide. In the case of silicon, the forming voltage $V_f$ is greater than the reference voltage $V_{fr}$ when the atomic concentration C of silicon is comprised between 0.1% and 2%, and the maximum value of the forming voltage $V_f$ seems to be reached for a concentration C of silicon of the order of 1%. Conversely, the forming voltage $V_f$ is less than the reference voltage $V_{fr}$ when the concentration C of silicon is greater than 2%. Conversely, in the case of aluminium, the forming voltage $V_f$ is always greater than the reference voltage $V_{fr}$ whatever the atomic concentration C of aluminium.

In the different embodiments described hereafter, the memory cells are OxRAM type memory cells in which the electrodes 1, 2 are made of titanium nitride, the oxide layer 3 is made of hafnium oxide and the reservoir layer 9 is made of titanium. In addition, the oxide layer 3 comprises a first zone 31 doped with aluminium or silicon in which the atomic concentration of aluminium or silicon is selected so as to locate the switching zone outside the first zone 31. In other words, it comes down to ensuring that the first doped zone 31 has a first forming voltage greater than the reference forming voltage in the non-doped oxide layer 3. Thus, by applying to the memory cell a forming voltage comprised between the reference voltage and the first forming voltage, it is possible to form the switching zone outside the first zone 31. The location of the switching zone in the memory cell is thus controlled, which makes it possible to reduce variability between the memory cells.

When the first zone 31 is doped with silicon, the atomic concentration of silicon in the first zone 31 is preferably comprised between 0.5% and 1.5%, for example of the order of 1%. Thus, referring to FIG. 4, the difference between the first forming voltage and the reference voltage is maximised.

When the first zone 31 is doped with aluminium, the first forming voltage does not reach a maximum. In this case, the atomic concentration of aluminium in the first zone 31 is advantageously selected so as to obtain a sufficient difference between the first forming voltage and the reference voltage to ensure that the switching zone does not form in the first zone 31. The atomic concentration of aluminium in the first zone 31 is thus preferably greater than 1%.

Figure 1B:
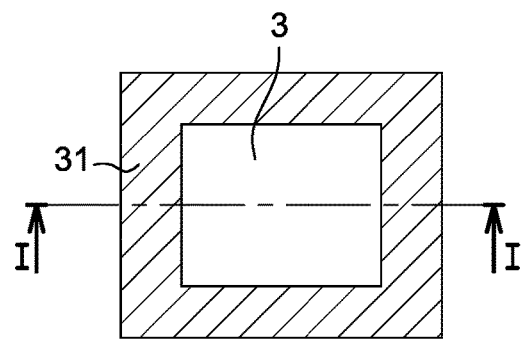
FIG. 1B schematically represents a top view of the oxide layer of the memory cell of FIG. 1A.

A first embodiment of memory cell 100 according to the invention is illustrated in FIGS. 1A and 1B, which represent respectively a transversal sectional view of the memory cell 100, and a top view of the oxide layer 3 of the memory cell 100. The transversal section is made along the section line I-I represented in FIG. 1B.

In this first embodiment, the first zone 31 extends to the periphery of the memory cell 100. Thus, the first forming voltage in the doped edges of the memory cell 100 is higher than the reference forming voltage in the non-doped part of the oxide layer 3, that is to say the centre of the memory cell 100. As described previously, it is then possible to form the filament at the centre of the memory cell 100 by applying to the latter a forming voltage comprised between the reference voltage $V_{fr}$ and the first forming voltage.

The memory cell may belong to a matrix comprising a multitude of memory cells adjacent to each other. It is known in the prior art to etch the oxide layer between the memory cells to avoid the formation of a switching zone between the upper electrode of a first memory cell and the lower electrode of a second memory cell adjacent to the first memory cell. Thanks to the invention, it is no longer necessary to etch the oxide layer 3 to delimit the memory cells, the first zone 31 forming an exclusion zone for the formation of the filament. The oxide layer 3 may thus be shared by several memory cells, which facilitates their manufacture.

Figure 2A:
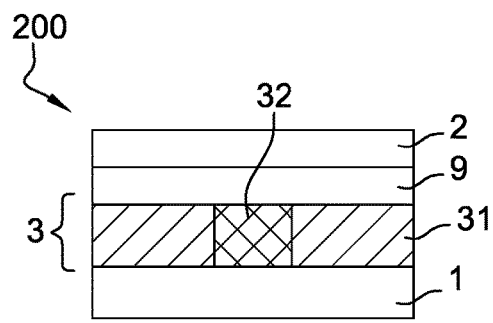
FIG. 2A schematically represents a transversal sectional view of a second embodiment of a memory cell according to the invention.
Figure 2B:
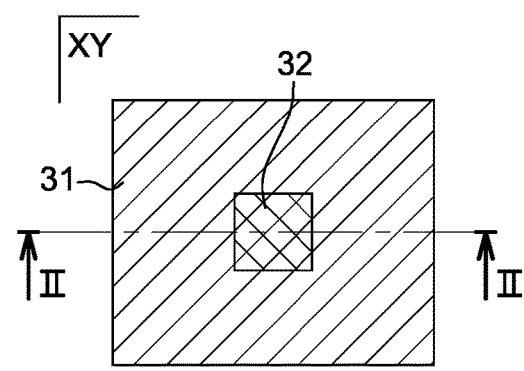
FIG. 2B schematically represents a top view of the oxide layer of the memory cell of FIG. 2A.

A second embodiment of a memory cell 200 according to the invention is illustrated in FIGS. 2A and 2B, which represent respectively a transversal sectional view of the memory cell 200, and a top view of the oxide layer 3 of the memory cell 200. The transversal section is made along the section line II-II represented in FIG. 2B.

In this second embodiment, the first zone 31 is doped with silicon and the oxide layer 3 comprises a second zone 32 also doped with silicon. The second zone 32 is arranged at the centre of the memory cell 200. The substrate extends along a reference plane XY in which the first zone 30 completely surrounds the second zone 32.

The atomic concentration of silicon in the second zone 32 is preferably greater than 3%. Thus, while referring to FIG. 4, the second zone 32 has a second forming voltage lower than the reference forming voltage. Consequently, by reducing the forming voltage applied to the memory cell 200, the formation of the filament is favoured in the second zone 32. In addition, the first zone 31, in which the first forming voltage is higher than the reference voltage, creates in fact confinement of the filament in the second zone 32 at the centre of the memory cell 200. The second zone 30 forms a potential well for the formation of the switching zone whereas the first zone 31 forms a potential barrier.

Furthermore, by reducing the forming voltage applied to the memory cell 200, it is also possible to reduce the size of the electronic circuit supplying the forming voltage, the size of the electronic circuit being directly linked to the value of the forming voltage to supply.

Preferably, the first zone 31 extends up to the periphery of the memory cell 200. It is thereby possible to dispense with a masking step during the manufacture of the memory cell 200, as described in greater detail hereafter.

Figure 3A:
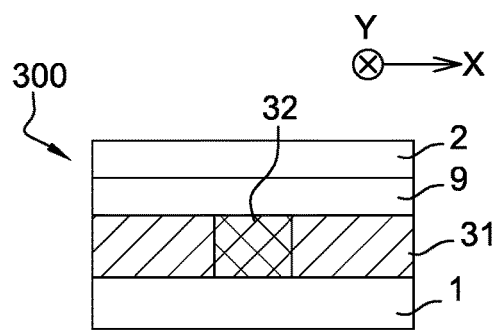
FIG. 3A schematically represents a transversal sectional view of a third embodiment of a memory cell according to the invention.
Figure 3B:
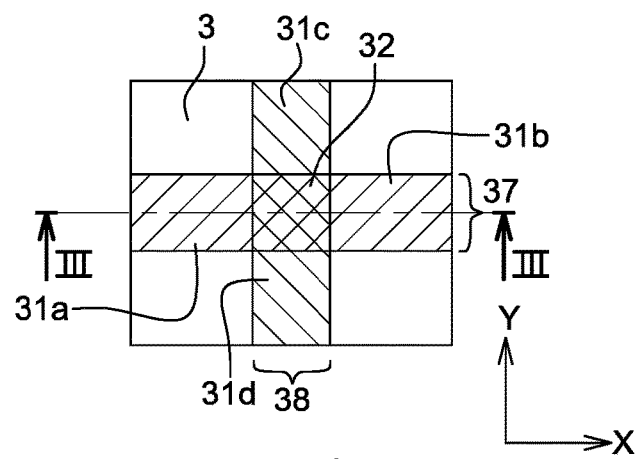
FIG. 3B schematically represents a top view of the oxide layer of the memory cell of FIG. 3A.

A third embodiment of a memory cell 300 according to the invention is illustrated in FIGS. 3A and 3B, which represent respectively a transversal sectional view of the memory cell 300, and a top view of the oxide layer 3 of the memory cell 300. The transversal section is made along the line III-III represented in FIG. 3B.

In this third embodiment, the first zone 31 is doped with silicon and the oxide layer 3 comprises a second zone 32 also doped with silicon. The first zone 31 comprises a first portion 31a and a second portion 31b which extend along a first direction X, as well as a third portion 31c and a fourth portion 31d which extend along a second direction Y substantially orthogonal to the first direction X. The first portion 31a and the second portion 31b are arranged on either side of the second zone 32 so that they form, with the second zone 32, a first trench 37 extending along the first direction X. Similarly, the third portion 31c and the fourth portion 31d are arranged on either side of the second zone 32 so that they form, with the second zone 32, a second trench 38 extending along the second direction Y. The first trench 37 and the second trench 38 cross each other at the level of the second zone 32 which is arranged at the centre of the memory cell 300.

Advantageously, the atomic concentrations of silicon in the first trench 37 and in the second trench 38 are each comprised between 0.1% and 2% and the total atomic concentration of silicon in the second zone 32, which is equal to the sum of the atomic concentrations of silicon in the first trench 37 and in the second trench 38, is greater than 3%. Thus, in a manner similar to the second embodiment, the formation of the switching zone is favoured in the second zone 32. For example, the atomic concentrations of silicon in the first trench 37 and in the second trench 38 are each of the order of 1.5%.

Figure 8A:
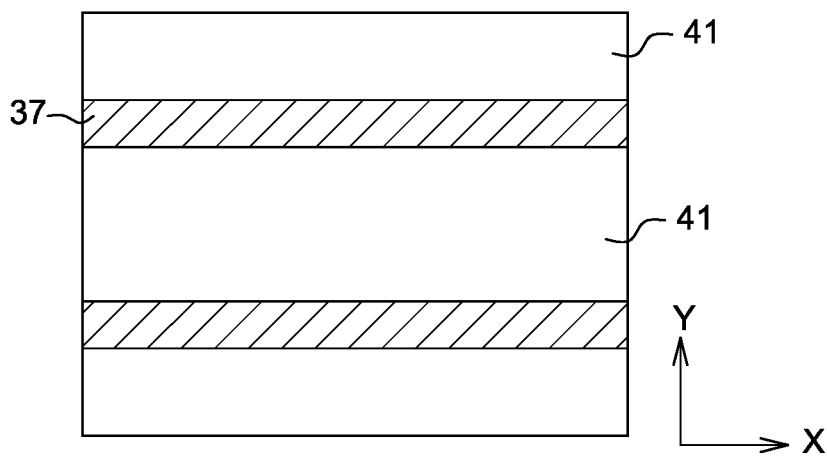
FIGS. 8A and 8B schematically represent in top view respectively a first implantation step and a second implantation step of a method for manufacturing the memory cell of FIG. 3A.
Figure 8B:
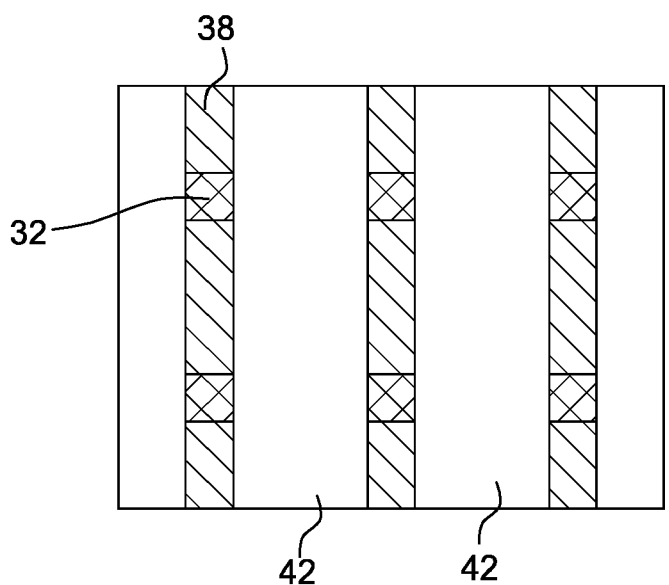
Figure 8C:
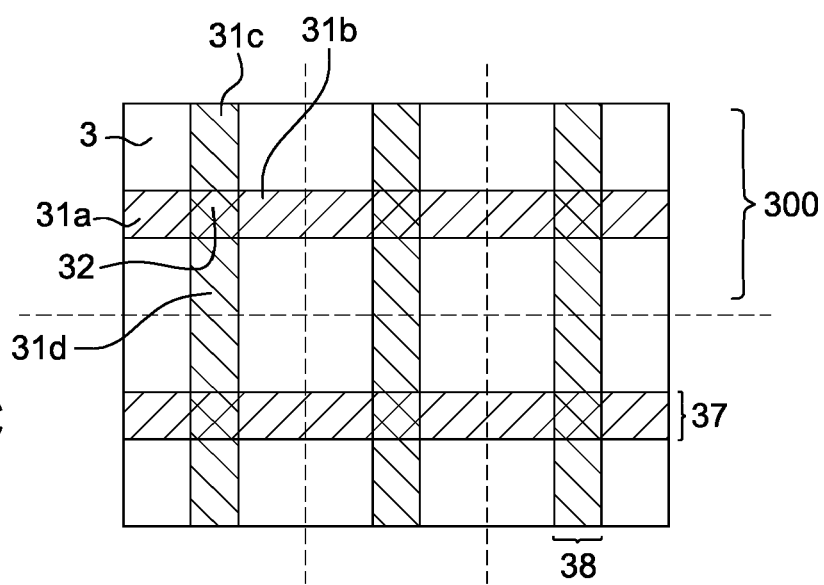
FIG. 8C schematically represents a top view of the oxide layer of a plurality of memory cells of FIG. 3A.

As described in greater detail hereafter with reference to FIGS. 8A to 8C, the doping of the oxide layer 3 is preferably obtained by ion implantation. The minimum size of the implanted zones is thus limited by the lithography methods. This configuration including two doping regions in the form of perpendicular trenches makes it possible to produce patterns of small size at the intersection of the trenches, whereas it would be difficult to produce these same patterns in an isolated manner in a single lithography step.

The present invention makes it possible to control the location of the switching zone as a function of the doping of the oxide layer 3. In the embodiments described previously, the switching zone is located at the centre of the memory cell, which makes it possible to improve the characteristics of the memory cell such as retention over time and maximum number of cycles. In addition, the controlled location of the switching zone makes it possible to avoid etching the oxide layer 3 to delimit the memory cells, the filament not risking being formed between two adjacent cells.

Another aspect of the invention relates to a method for manufacturing 500 a memory cell such as those described previously. The memory cell belongs to a matrix comprising a multitude of memory cells laid out in lines and columns. For reasons of simplification, only several memory cells are represented in the figures accompanying the description of the steps of the manufacturing method 500.

Figure 5:
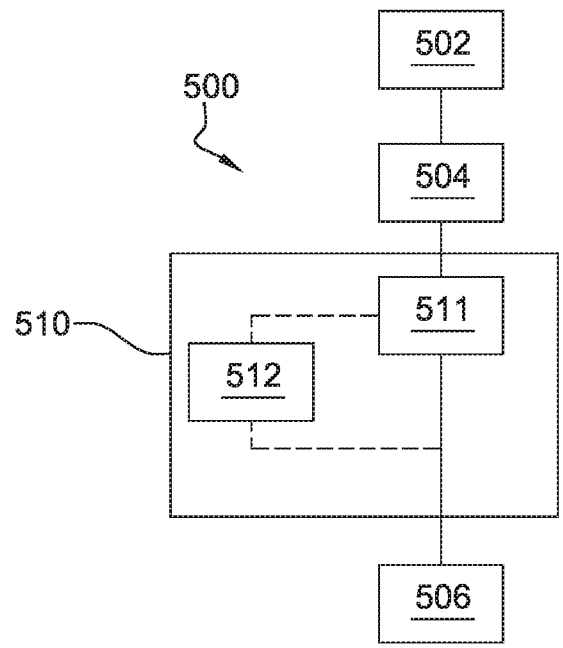
FIG. 5 illustrates the main steps of a method for manufacturing a memory cell according to the invention such as the memory cells of FIG. 1A, 2A or 3A.

The main steps of the manufacturing method 500 are illustrated in FIG. 5. The manufacturing method 500 comprises a step 502 of formation of the lower electrode 1, a step 504 of formation of the oxide layer 3 and a step 506 of formation of the upper electrode 2. These different steps of formation are carried out by means of known deposition methods such as sputtering, atomic layer deposition (ALD), physical vapour deposition (PVD), or chemical vapour deposition (CVD).

During step 506 of formation of the upper electrode 2, an electrically conductive layer is deposited on the oxide layer 3. This conductive layer is next etched to form the upper electrode 2 of each memory cell. The etching of the conductive layer follows for example a plot represented by dotted lines in FIGS. 6B, 7B and 8C. The upper electrode 2 of each memory cell is thereby isolated individually.

In other embodiments, for example to produce a crossbar type architecture, the conductive layer may be etched in such a way as to form lines or columns of memory cells, each line or each column having the same upper electrode 2.

As has already been said previously, it is not necessary to etch the oxide layer 3 to delimit the memory cells because the switching zone forms in a controlled manner in a zone far from the edges of the memory cell. The switching zone thus cannot form between two adjacent memory cells. The oxide layer 3 and the lower electrode 1 may thus be common to several memory cells. Taking once again for example the case of the crossbar architecture in which the upper electrode 2 is common to several memory cells arranged in columns (respectively in lines), the oxide layer 3 may be etched at the same time as the conductive layer intended to form the lower electrode 1 in such a way as to form lines (respectively columns) of memory cells.

The manufacturing method 500 also comprises a step 510 of formation in the oxide layer 3 of the first zone 31 doped with the doping element, that is to say aluminium or silicon with regard to the embodiment of FIG. 1A, and silicon with regard to the embodiments of FIGS. 2A and 2B. Preferably, the step of formation of the first zone 31 comprises a first step 511 of ion implantation of aluminium or silicon. Ion implantation is a very well controlled method, which makes it possible to obtain with precision the desired doping in the oxide layer 3.

To obtain the memory cell 100 of FIG. 1A, the first implantation step 511 is carried out in the first zone 31. The first implantation step 511 is advantageously carried out at a first dose that is selected so as to obtain the desired atomic concentration of doping elements. For example, to dope an oxide layer of hafnium of 10 nm thickness at an atomic concentration of silicon comprised between 0.1% and 2%, the silicon may be implanted at an energy of 4 keV with a dose comprised between $8 \times 10^{13}$ atoms per $cm^{-2}$ and $1.6 \times 10^{15}$ atoms par $cm^{-2}$.

Figure 6A:
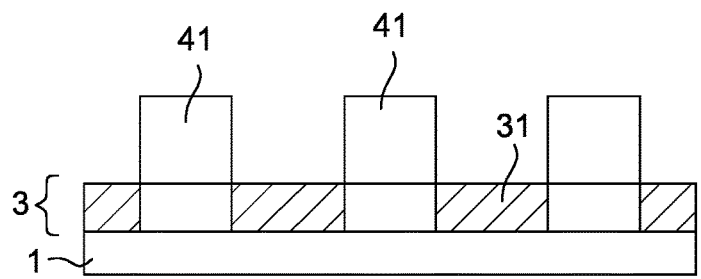
FIGS. 6A and 6B schematically represent a first implantation step of a method for manufacturing the memory cell of FIG. 1A, respectively in transversal sectional view and in top view.
Figure 6B:
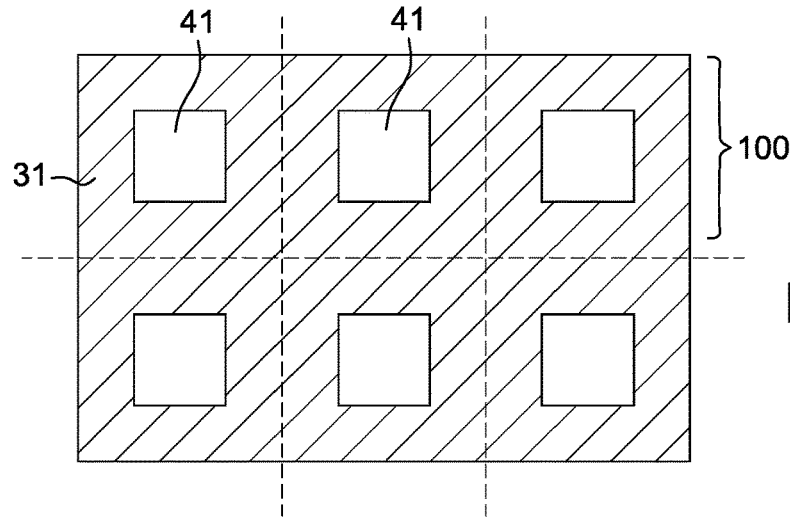

The first implantation step 511 advantageously comprises a first operation of masking the oxide layer 3 so as to expose the first zone 31 to the ion implantation. To do so, a first mask 41 is arranged on the oxide layer 3. The first mask 41 has a pattern that differs from one embodiment to another. For example, FIGS. 6A and 6B show the pattern used to obtain the memory cell 100 of FIG. 1A.

The step of formation 510 of the first zone may advantageously comprise, in addition to the first implantation step 511, a second step 512 of ion implantation of silicon in a second region of the oxide layer, the first region and the second region merging at least partially and forming:
  the first zone of the oxide layer in which the first region and the second region are not merged; and
  a second zone of the oxide layer in which the first region and the second region are merged;
the first implantation step (510) and the second implantation step being carried out at doses such that silicon is present in the second zone at a total atomic concentration that is selected so as to locate the switching zone in the second zone.

To obtain the memory cell 200 of FIG. 2A, the first step 511 of ion implantation of silicon is advantageously carried out over the entire surface of the oxide layer 3. It is thereby possible to economise the first operation of masking, which represents a saving in time and money.

Figure 7A:
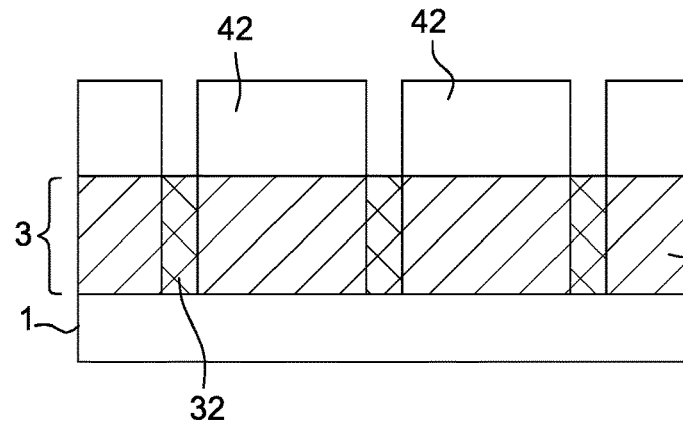
FIGS. 7A and 7B schematically represent a second implantation step of a method for manufacturing the memory cell of FIG. 2A, respectively in transversal sectional view and in top view.
Figure 7B:
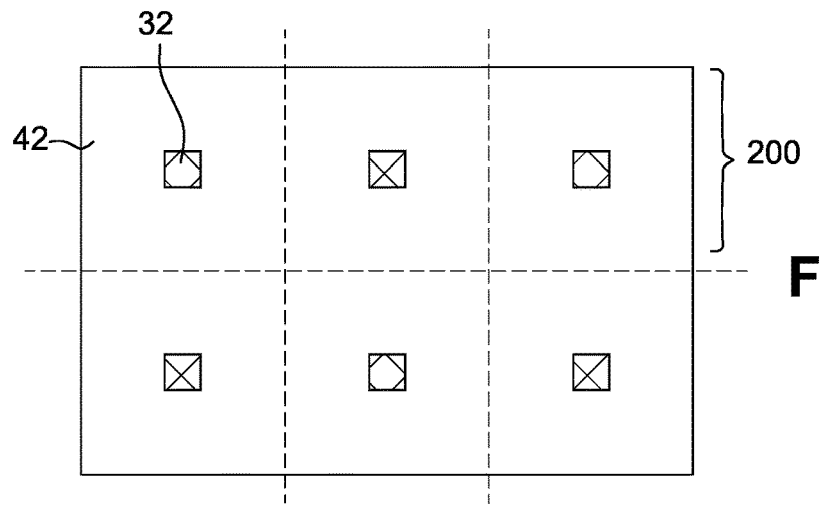

In this embodiment, the step of formation 510 also comprises a second step 512 of ion implantation of silicon in the second zone 32 of the oxide layer 3. The second implantation step 512 advantageously comprises a second operation of masking the oxide layer 3 so as to expose the second zone 32 to the ion implantation. To do so, a second mask 42 is arranged on the oxide layer 3. The second mask 42 has a pattern that differs from one embodiment to another. For example, FIGS. 7A and 7B show the second mask 42 used to obtain the memory cell 200 of FIG. 2A.

In this embodiment, the second implantation step 512 is carried out at a second dose that is selected so that the total atomic concentration of silicon in the second zone 32 is greater than 3%. Given that the first implantation step 511 is carried out over the entire surface of the oxide layer 3, the second implanted dose is added to the first dose implanted in the second zone 32.

FIGS. 8A to 8C show a particularly advantageous embodiment of the manufacturing method 500 making it possible to obtain the memory cell 300 of FIG. 3A. FIG. 8A shows the first mask 41 used to form, during the first implantation step 511, the first trenches 37 extending along the first direction X. FIG. 8B shows the second mask 42 used to form, during the second implantation step 512, the second trenches 38 extending along the second direction Y. The intersection of the trenches 31, 32 form the second zones 32 in which the implanted doses are added together.

Advantageously, the doses to implant are selected such that the atomic concentration of silicon in each trench 37, 38 is comprised between 0.1% and 2% and that the total atomic concentration of silicon in the second zone 32 is greater than 3%. Thus, the formation of the switching zone is favoured in the second zone 32. This embodiment fully exploits the profile of variation in the forming voltage as a function of atomic concentration, illustrated in FIG. 4. It is thereby possible to form easily, by two successive masking operations, intersection patterns of very small dimensions, for example below 10 nm, which otherwise would be difficult to produce in a single masking operation.

In this embodiment, the upper electrode 2 of each cell 300 is formed so as to be arranged above the second zone 32, as represented by dotted lines in FIG. 8C.

In the different embodiments of the manufacturing method 500 described previously, the first implantation step 511 and the second implantation step 512 may be carried out in any order.

The different operations of masking the oxide layer 3 are carried out by means of known lithography methods such as deep ultraviolet lithography, electron beam, or based on the self-assembly of block copolymers.

Figure 9:
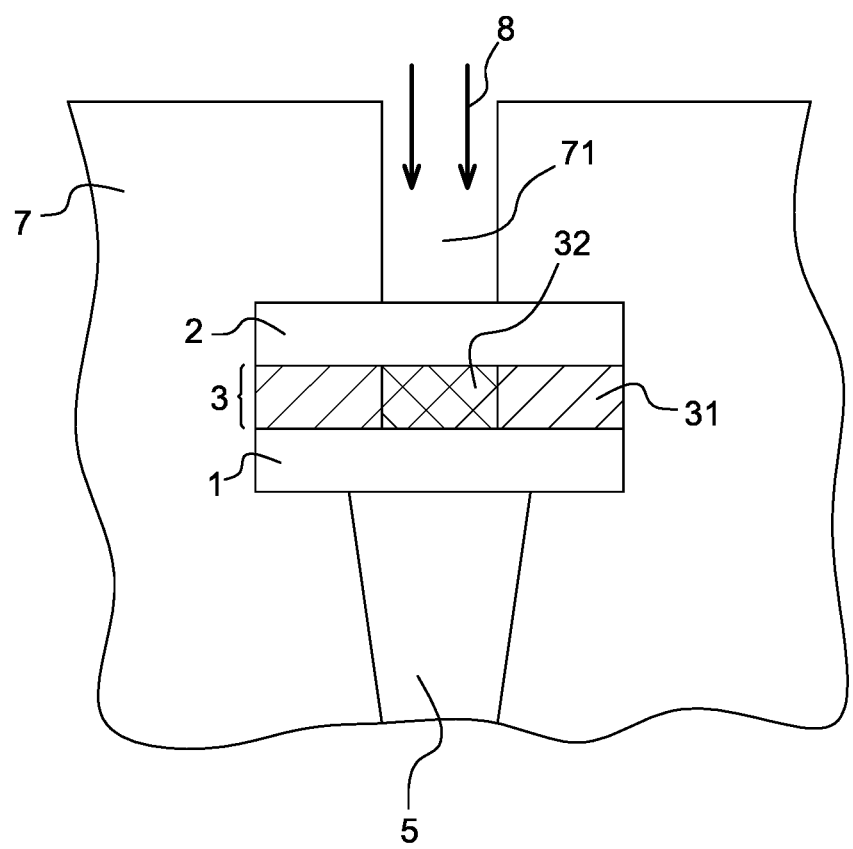
FIG. 9 schematically represent a second ion implantation step according to an embodiment of the method of the invention.

FIG. 9 illustrates the second step of ion implantation according to another embodiment of the method of the invention. In this case, the memory cell is formed on an electrical contact 5 which electrically connects the first electrode 1 for example to a circuit (not represented) formed in the lower layers on the substrate. This memory cell is encapsulated in an insulator material 7, such as a silicon oxide (SiO$_x$), which is next planarised for example by means of a chemical mechanical planarisation method, also called CMP.

An opening 71 is produced in the insulator material 7 so as to be able to form an electrical contact on the second electrode 2. Advantageously, the insulator material 7 is used as mask to carry out the second step of ion implantation, symbolised by arrows 8, through the opening 71. This thus avoids having a step of formation of a mask specific to the second implantation step which makes it possible to reduce the cost and the manufacturing time of the memory cell. In addition, the switching zone of the memory cell is thus aligned with the electrical contact of the second electrode 2, which is particularly advantageous in the case of memory cells having small lateral dimensions, for example substantially equal to those of the electrical contact. By avoiding an additional masking step, misalignments between the different layers are minimised which facilitates the reduction in the size of the memory cells.

Naturally, the invention is not limited to the embodiments described with reference to the figures and alternatives could be envisaged without going beyond the scope of the invention.

In an alternative embodiment, several ion implantation steps may be carried out using a single mask. The implanted ions come from a source which, at each implantation step, forms an incidence angle with a direction normal to the plane of the substrate. Between each implantation step, the relative position of the source with respect to the substrate is then modified such that the implanted ions come from several directions. For example, in the case where four implantation steps are carried out, the relative position of the source with respect to the substrate may be modified by a quarter turn.

This alternative embodiment makes it possible to obtain in a zone thereby doped a gradient of the atomic concentration of doping elements, which implies a gradient of the forming voltage. Indeed, the implanted zone is delimited by the edges of the mask. The source of the ions being inclined with respect to the plane of the substrate, the atomic concentration of doping elements in the implanted zone is lower near to the edges of the mask and increases progressively up to the centre of the implanted zone.

In another alternative embodiment, the implantation steps may be carried out, all or in part only, after the deposition on the oxide layer 3 of the electrically conductive layer intended to form the upper electrode 2. The doping elements are then implanted through the conductive layer. Thus, for example, the masks used to deposit metal contacts on the upper electrode 2 may be used beforehand to implant the doping elements in the oxide layer 3.

The invention claimed is:

1. Resistive non-volatile memory cell comprising a first electrode, a second electrode and an oxide layer arranged between the first electrode and the second electrode, the memory cell being capable of reversibly switching between:
    a high resistance state obtained by applying a first bias voltage between the first electrode and the second electrode; and
    a low resistance state obtained by applying a second bias voltage between the first electrode and the second electrode;
the oxide layer comprising a unique switching zone forming a favored conduction path for the current passing through the memory cell when the memory cell is in the low resistance state, wherein the oxide layer comprises a first zone doped with aluminium or silicon, a difference of an atomic concentration of the alumunium or the silicon between the first zone and a second zone of the oxide layer outside the first zone being selected such that said difference by itself allows the unique switching zone to be located in said second zone outside the first zone, wherein the atomic concentration of the aluminium or the silicon in the first zone is greater than 0% and up to 5% and the atomic concentration of the aluminium or the silicon in the second zone is from 0% to 5%.

2. The memory cell according to claim 1, wherein the first zone extends to a periphery of the memory cell.

3. The memory cell according to claim 1, wherein the first zone is doped with silicon, the atomic concentration of silicon in the first zone being comprised between 0.1% and 2%.

4. The memory cell according to claim 3, wherein the oxide layer comprises the second zone doped with silicon, the silicon being present in the second zone at the atomic concentration that is selected so as to locate the switching zone in the second zone.

5. The memory cell according to claim 4, wherein the first zone completely surrounds the second zone.

6. The memory cell according to claim 4, wherein the first zone comprises:
    a first portion and a second portion extending on either side of the second zone along a first direction;
    a third portion and a fourth portion extending on either side of the second zone along a second direction substantially orthogonal to the first direction.

7. The memory cell according to claim 1, wherein the atomic concentration of silicon in the second zone is greater than 3% and up to 5%.

8. The memory cell according to claim 1, wherein the oxide layer comprises a material among the following: hafnium oxide, tantalum oxide.

9. Method for manufacturing a resistive non-volatile memory cell-comprising a first electrode, a second electrode and an oxide layer arranged between the first electrode and the second electrode, the memory cell being capable of reversibly switching between:
    a high resistance state obtained by applying a first bias voltage between the first electrode and the second electrode; and
    a low resistance state obtained by applying a second bias voltage between the first electrode and the second electrode;
the oxide layer comprising a unique switching zone forming a favored conduction path for the current passing through the memory cell when the memory cell is in the low resistance state, the method further comprising forming in the oxide layer a first zone doped with aluminium or silicon, a difference of an atomic concentration of alumunium or silicon between the first zone and a second zone of the oxide layer outside the first zone being selected such that said difference by itself allows the unique switching zone to be located in said second zone outside the first zone, wherein the atomic concentration of the aluminium or the silicon in the first zone is greater than 0% and up to 5% and the atomic concentration of the aluminium or the silicon in the second zone is from 0% to 5%.

10. The method according to claim 9, wherein the forming comprises a first step of ion implantation of aluminium or silicon in the first zone.

11. The method according to claim 9, wherein the forming comprises a first step of ion implantation of silicon in a first region of the oxide layer and a second step of ion implantation of silicon in a second region of the oxide layer, the first region and the second region merging at least partially and forming:

the first zone of the oxide layer in which the first region and the second region are not merged; and the second zone of the oxide layer in which the first region and the second region are merged;

after the first implantation step and the second implantation step are carried out, silicon is present in the second zone at the atomic concentration that is selected so as to locate the switching zone in the second zone.

12. The method according to claim 11, wherein the first implantation step comprises a first operation of masking the oxide layer carried out in such a way that the first region forms a first trench extending along a first direction, and wherein the second implantation step comprises a second operation of masking the oxide layer carried out in such a way that the second region forms a second trench extending along a second direction substantially orthogonal to the first direction, the second trench crossing the first trench, the second zone being formed by the intersection of the first trench and the second trench.

13. The method according to claim 11, further comprising depositing, on the oxide layer, an electrically conductive layer intended to form an electrode, the first implantation step and/or the second implantation step being carried out after the depositing of the electrically conductive layer.

* * * * *